United States Patent [19]

Shimada et al.

[11] Patent Number: 4,495,820
[45] Date of Patent: Jan. 29, 1985

[54] CAPACITIVE PRESSURE SENSOR

[75] Inventors: Satoshi Shimada; Kazuji Yamada, both of Hitachi; Seikou Suzuki, Hitachiota; Motohisa Nishihara, Katsuta, all of Japan

[73] Assignee: Hitachi, Ltd., Tokyo, Japan

[21] Appl. No.: 426,084

[22] Filed: Sep. 28, 1982

[30] Foreign Application Priority Data

Sep. 30, 1981 [JP] Japan ................. 56-153611

[51] Int. Cl.³ ..................... H01G 7/00; H01L 29/84
[52] U.S. Cl. ................................. 73/724; 357/26; 361/283
[58] Field of Search .............. 73/724, 718; 361/283; 357/26; 307/303, 308

[56] References Cited

U.S. PATENT DOCUMENTS

| | | | |
|---|---|---|---|
| 3,880,009 | 4/1975 | Johnston | 73/724 |
| 4,064,550 | 12/1977 | Dias | 73/724 X |
| 4,277,814 | 7/1981 | Giachino | 73/724 X |
| 4,381,788 | 5/1983 | Douglas | 361/283 X |
| 4,389,895 | 6/1983 | Rud | 73/724 |
| 4,405,970 | 9/1983 | Swindal | 73/724 X |
| 4,426,673 | 1/1984 | Bell | 73/724 X |
| 4,432,007 | 2/1984 | Cady | 357/26 |

OTHER PUBLICATIONS

A Monolithic Capacitive Pressure Sensor with Pulse-Period Output, Craig S. Sander et al., IEEE, vol. ED27, No. 5, May 1980, pp. 927–930.

Miniature Capacitive Pressure Transducer for Biomedical Application, Y. D. Hong et al., Conference CECON 80, Cleveland, 5/20-22/80.

Primary Examiner—Donald O. Woodiel
Assistant Examiner—Vincent P. Kovalick
Attorney, Agent, or Firm—Antonelli, Terry & Wands

[57] ABSTRACT

A capacitive pressure sensor and its manufacturing method are disclosed. An amplifier is formed on the main surface of a first semiconductor substrate by a diffusion process, and its surface is covered with an insulating film. An electrode is vapor-deposited on the surface of the amplifier and electrically connected to the amplifier through a through hole formed in the insulating film. For forming a diaphragm, the surface of a second semiconductor substrate disposed facing the electrode to form a capacitor, which is opposite to the surface of the second semiconductor substrate facing the electrode, is partially etched away to form a depression. The first and second semiconductor substrates are anodically bonded to each other using a glass layer.

14 Claims, 4 Drawing Figures

CAPACITIVE PRESSURE SENSOR

BACKGROUND OF THE INVENTION

The present invention relates to a capacitive pressure sensor and its manufacturing method and, more particularly, to a capacitive pressure sensor in which a sensor portion and an amplifier are formed on a semiconductor monocrystalline layer.

In one of this type of the prior sensors, an amplifier is formed on a main surface of a semiconductor substrate. A diaphragm is formed with a depression on the surface opposite to the main surface. A connection layer electrically connects the diaphragm and the amplifier. A glass plate with an electrode plate is placed, in opposition to the diaphragm, on the main surface of the semiconductor substrate to form a capacitor. This sensor is disclosed in IEEE TRANSACTIONS ON ELECTRON DEVICES, VOL. ED-27, No. 5, May 1980, pp 927 to 930. In the capacitive pressure sensor, a pn junction electrically isolates a connection layer for connecting the diaphragm and the electrode plate to the amplifier from its adjacent layer. A large capacitance is formed at the pn junction, in addition to the capacitance formed between a diaphragm and the plate electrode. The capacitor at the pn junction is susceptable to a change in ambient temperature. The prior sensor has the depression in which the electrode plate is vapor-deposited on the glass plate. A dimensional requirement for the depth of the depression is stringent because it determines a capacitance of the sensor. Nevertheless, the accuracy of finishing is not satisfactory. Since the layer for forming the amplifier and the diaphragm deformable by pressure are closely disposed in the semiconductor substrate and since a process for forming the diaphragm is different from a process for forming the amplifier, the yield rate cannot be increased. Further, the formation of them makes it difficult to control the thickness of the diaphragm which is desired to be of 10 $\mu$m order in the manufacturing stage. Improvement of a sensitivity of the sensor is also hindered. Another physical feature that the amplifier and the diaphragm are formed on the same side, limits its areal reduction.

A capacitive pressure sensor with no semiconductor substrate is disclosed in Japanese Patent Application Kokai (Laid-Open) No. 143422/80 (corresponding to U.S. patent application Ser. No. 30,587). In this type of the capacitive pressure sensor, a pair of diaphragms oppositely disposed with a gap therebetween are bonded together by frit glass set around the periphery. A capacitor is formed by electrodes vapor-deposited on the inner surfaces of the confronting diaphragms. In manufacturing the capacitive pressure sensors, difficulty encountered in making the expansion coefficient of the frit glass coincident with that of the material of the diaphragm such as ceramics or rock crystal. In the bonding process, it is desired that the melting point of the glass is as low as possible. Nevertheless, it is difficult to find glass whose the melting point is low and whose the thermal expansion coefficient is substantially equal to that of material of the diaphragm, since the expansion coefficient is inversely proportional to the melting point. This causes the above difficulty. The existing difference of the expansion coefficients produces a thermal distortion between the diaphragms and the glass in the heating and cooling processes of the manufacturing the pressure sensors. The thermal distortion leads to a variation of capacitances of the resultant products, or capacitive pressure sensors. The measure tentatively taken for the thermal distortion problem is to use thick diaphragms with increased rigidity. This measure impairs a sensitivity of the pressure sensor, however.

SUMMARY OF THE INVENTION

Accordingly, an object of the present invention is to provide a capacitive pressure sensor at a high sensitivity which is well adaptable for mass production of the sensors.

Another object of the present invention is to provide a capacitive pressure sensor with a high sensitivity and an improved temperature characteristic.

According to the present invention, an amplifier is formed on a main surface of a first semiconductor substrate. An electrode is formed on the surface of the amplifier with an insulating layer interposed therebetween. A second semiconductor substrate with a diaphragm confronting with the electrode to form a capacitor is anodically bonded to the first substrate through a glass layer.

BRIEF DESCRIPTION OF THE PREFERRED EMBODIMENT

Figure 1:
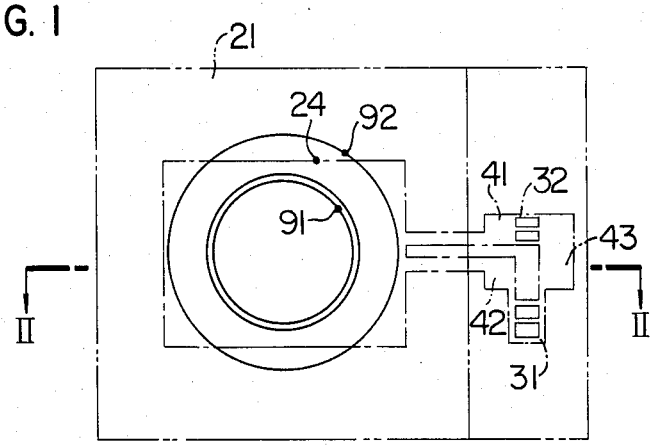
FIG. 1 shows a plan view of a capacitive pressure sensor which is an embodiment of the present invention, in which an upper semiconductor substrate is removed.
Figure 2:
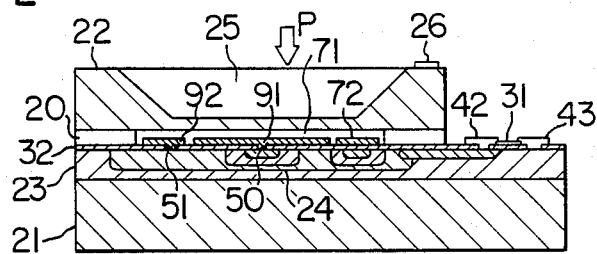
FIG. 2 shows a cross sectional view taken on line II—II of FIG. 1.

Referring to FIGS. 1 and 2, a semiconductor substrate 21 made of silicon single crystal has an epitaxial growth layer 23 of the conductivity different from that of the semiconductor substrate 21.

The epitaxial growth layer 23 has a plurality of diffusion layers overlaid thereon to provide an IC amplifier 24 in which transistors, diodes and capacitors are included. The amplifier amplifies and converts a capacitance into a voltage signal, a current signal, or a frequency signal. A protective film 32 made of silicon oxide, for example, is formed on the surface of the epitaxial growth layer 23 bearing such amplifier 24.

A circular electrode 91 formed on the amplifier 24 in the protective film 32 is connected to a diffusion layer of the amplifier 24 through a through hole 50 in the protective film 32. A ring electrode 92 is formed on the protective film 32, surrounding the circular electrode 91. The electrode 92 is connected to the amplifier 24 through a through hole 51 in the protective film 32.

A conductive semiconductor substrate 22 is placed on the protective film 32 through a glass film 20, and located above the electrodes 91 and 92. A gap 71 is provided between the bottom surface of the semiconductor substrate 22 and the electrodes 91 and 92. A variable capacitor is formed between the semiconductor substrate 22 and the electrode 91. A fixed capacitor is formed between the semiconductor substrate 22 and the electrode 92.

An upwardly opening depression 25 is formed in the semiconductor substrate 22. The depression is formed by subjecting the semiconductor substrate 22, with the crystal plane (100) selected, to an anisotropic etching process using alkali solution. The semiconductor substrate is thus partially etched away to have the depression 25 thinned at the portion corresponding to the bottom of the depression 25. The thinned part of the semiconductor substrate 22 serves as a diaphragm, which bends upon application of pressure P in the pressure direction.

Figure 3:
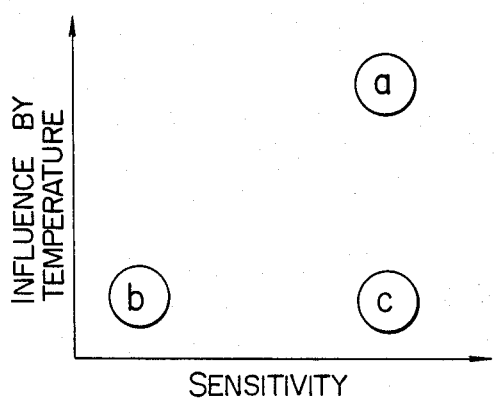
FIG. 3 is an explanatory diagram for illustrating a feature of the present invention.

The portion of the semiconductor substrate 22 where the depression 25 is not formed is relatively thick. The semiconductor substrate 22 is fixed at this portion to the protective film 32 with the glass film 20 lying therebetween. In other words, the peripheral portion of the semiconductor substrate 22 is relatively thick to have a relatively high rigidity. The rigid peripheral portion of the substrate 22 lessens the adverse effect of thermal distortion due to a temperature change upon a temperature characteristic of the pressure sensor while the diaphragm portion of the semiconductor substrate is sensitive to the applied pressure, since it is etched to be thin. Although the paired thin diaphragms bonded by the frit glass of the prior pressure sensor has a high sensitivity, as indicated by a portion ⓐ in FIG. 3, it is greatly influenced by temperature. For solving the temperature problem, the diaphragm is made thick. Although a thick diaphragm is insensitive to temperature change, as indicated by a portion ⓑ in FIG. 3, such a diaphragm is also insensitive to the pressure and has a low pressure sensitivity. In the present invention, however, the diaphragm per se is made thin but its peripheral portion is made thick like the substrate 22 of FIG. 2. The semiconductor substrate thus shaped provides a pressure sensor which has a high sensitivity and is substantially uninfluenced by temperature change, as indicated by a portion ⓒ in FIG. 3.

A glass layer 20 whose thermal expansion coefficient is similar to that of the semiconductor substrate 22 is formed beneath the lower surface of the semiconductor substrate 22 and around the diaphragm, by a sputtering process. The glass layer 20 is anodically bonded to the semiconductor substrate 22. For the anodic bonding process, reference is made to U.S. Pat. No. 3,397,278. The glass layer 20 is heated at temperature lower than its melting point, e.g. 300° to 400° C., and is applied with high voltage. At this time, sodium contained in the glass is activated and its ions move to form a depletion layer at the junction between the glass layer 20 and the semiconductor substrate 22. Under this condition, if the application of the heating and the voltage is removed, the inter-ion force bonds the glass layer 20 to the semiconductor substrate 22. The anodic bonding process can bond them without melting of the glass layer. This bonding method allows the gap 71 to be spaced precisely. Since the heating temperature is relatively low at the bonding, substantially no thermal distortion occurs in these layers.

Generally, a capacitance C of the capacitor is given by $$C = \epsilon(A/X) \quad (1)$$

where A is an electrode area, x is a gap, and $\epsilon$ is a dielectric constant. Hence, we have $$dC/dx = -\epsilon(A/x^2) \quad (2)$$

This equation indicates that the larger the gap, the better the sensitivity. If the anodic bonding process is used, the gap 71 can be formed small and accurate. The pressure sensors manufactured using the anodic bonding process has a high sensitivity.

An electrode 26 to be coupled with common potential is formed on the semiconductor substrate 22. Electrodes 41, 42 and 43 are formed in the region on the protective film 32 where no semiconductor substrate 22 is placed. The electrodes 41 and 42 are connected to voltage output terminals of an amplifier. Resistor networks 31 and 32 are formed among the electrodes 41, 42 and 43. The resistance of the resistor networks 31 and 32 can be adjusted by properly trimming a branch or branches of the resistor networks by using an electron beam. The trimming of the resistor networks can adjust the offset and sensitivity of the capacitor and amplifier. Since the capacitances between the electrode 91 and 26 and between the electrode 92 and 26 change with a change of ambient temperature, a difference between both the capacitances is insensitive to the temperature change. Only the former capacitance changes with respect to a change of pressure P, while the latter is unchanged. Thus, the capacitance difference is proportional to a change of pressure and a pressure P can be detected on the basis of the change of the capacitor difference. In the capacitive pressure sensor thus arranged, if the space forming the capacitor is evacuated to be isolated from atmosphere, the pressure sensor acts as an absolute pressure reference, while if the space is communicated into the atmosphere, the pressure sensor acts as a relative pressure type. When pressure P is applied to the depression in the direction of the arrow, the central part of the semiconductor substrate 22 which serves as a diaphragm is bent to narrow the gap between the bottom face of the diaphragm and the electrode 91. The result is an increase of the capacitance of the capacitor. The gap between the electrode 92 and the semiconductor substrate 22 undergoes substantially no change under the pressure applied, because the electrode 92 is located near the fixing part of the diaphragm with substantially no change of the capacitor. The capacitance changes of the two capacitors are produced in the form of voltage signals, through the amplifier 24.

With such a construction, the electrodes 91 and 92 disposed in opposition to the semiconductor substrate 22 serve as the electrodes for the amplifier 24 on the semiconductor substrate 21. Accordingly, the electrodes 91 and 92 never cross the pn junction for insulating the amplifier 24 from the epitaxial growth layer 23. This fact indicates that the capacitances detected are only those of the capacitors between the semiconductor substrate 22 and the electrode 91 and between the substrate 22 and the electrode 92. The change of the capacitance is converted to a voltage signal by the amplifier 24 and is outputted on the electrodes 41, 42 and 43. Accordingly, the output voltage signal is not affected by the stray capacitance and further precise capacitances can be detected even if ambient temperature changes. In the present embodiment, the semiconductor substrates 21 and 22 are made of the same material. The glass layer 20 which serves as an adhesive is made of pyrex with an expansion coefficient approximate to that of the semiconductor substrates. Because of the use of pyrex for the glass layer 20, the thickness of the film may be made very thin, for example, several $\mu$m. The result is that no thermal distortion is produced therein, thus eliminating a capacitance change arising from temperature change.

The semiconductor substrates 21 and 22 are fixed with the glass layer 20 formed by the sputtering process, which is interposed therebetween using the anodic bonding process and without melting of the glass layer 20. The gap between the semiconductor substrates 21 and 22 can precisely be small. The upper surface of the semiconductor substrate 22 is subjected to the anisotropy etching of the silicon single crystal thereby to form a depression serving as the diaphragm. Because of use of this manufacturing method, the diaphragm can be made very thin.

Additionally, the semiconductor substrate 22 serving as the diaphragm and the semiconductor substrate 21 containing the amplifier 24 are layered one substrate on another. This leads to size reduction of the pressure sensors.

Figure 4:
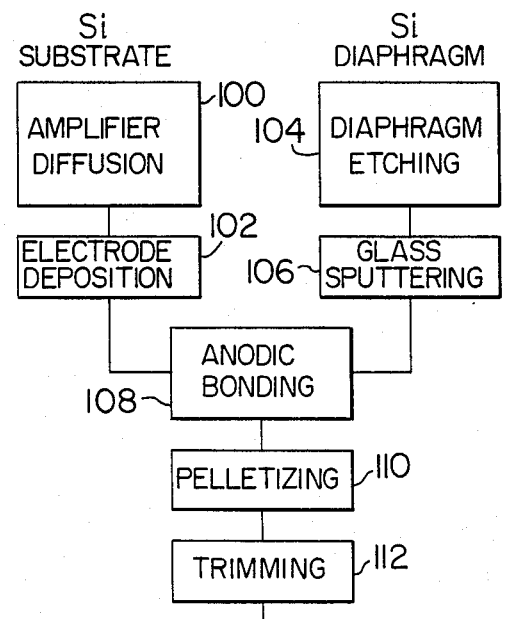
FIG. 4 shows a flow chart illustrating a process flow in manufacturing a pressure sensor according to the present invention.

A manufacturing method of a capacitive pressure sensor according to the present invention will be described referring to FIG. 4. In a step 100, impurity is diffused into the main surface of the silicon semiconductor substrate 21 thereby forming an amplifier 24. The entire main surface of the substrate is covered with an oxide film 32. In a step 102, the oxide film is partially removed by a photolithography process. Then, aluminum is vapor-deposited over the resultant structure, thereby to form electrodes 91, 92, 41, 42 and 43, and the resistor networks 31 and 32.

In a step 104, the semiconductor substrate 22 is partially etched away to form the diaphragm. In a step 106, the glass film 20 is formed at the periphery of the diaphragm by the sputtering process. The formation can be also achieved by the chemical vapor deposit method, but in this case, the heat treatment is required to increase the strength of the bonding.

In a step 108, the glass layer 20 is bonded to the oxide film 32 by the anodic bonding process. Then in a step 110, the structure is pelletized into pressure sensors, and in a step 112 the resistors in the resistor networks of the pressure sensors are properly trimmed to adjust the offset value. The step 106 for the glass sputtering may be located after the step 102, in order that it is applied to the semiconductor substrate 21.

According to this method, the substrates can be formed in separate manufacturing steps. Therefore, there is no need for process alignment between them. Furthermore, a high precision fine working is applied to a wafer by the alkali etching process based on the anisotropy of silicon. The anodic bonding likewise is applied to the wafer and then pelletized. As a result, several hundred to several thousand sensor chips can be produced at a time.

As seen from the foregoing, a capacitive pressure sensor according to the present invention is excellent in sensitivity and temperature characteristic, and is well adaptable for mass production.

We claim:

1. A capacitive pressure sensor comprising:
    a first semiconductor substrate with an amplifier formed on the main surface;
    an insulating layer formed on said amplifier;
    at least one electrode formed on said amplifier through said insulating layer and electrically connected to said amplifier;
    a second semiconductor substrate serving as a diaphragm and disposed in opposition to said electrode for forming a capacitor; and
    a glass layer anodically bonding said first and second semiconductor substrates to each other in the region of peripheral portions of said electrode and said diaphragm.

2. A capacitive pressure sensor according to claim 1, wherein said glass layer is a sputtered glass.

3. A capacitive pressure sensor according to claim 1, wherein said glass layer is a chemical vapor deposited glass.

4. A capacitive pressure sensor according to claim 1 or 2, further comprising a resistor network arranged for being trimmed and being formed in a surface region of said first semiconductor substrate except the surface region occupied by said second semiconductor surface.

5. A capacitive pressure sensor according to claim 1 or 2, wherein in said second semiconductor substrate a diaphragm is formed by forming a depression on the surface opposite to that facing said electrode.

6. A capacitive pressure sensor according to claim 1 or 2, wherein said electrode is connected to said amplifier through a through hole provided in said insulating layer.

7. A capacitive pressure sensor according to claim 1 or 2, wherein said electrode includes a central electrode and a peripheral electrode formed around said central electrode.

8. A capacitive pressure sensor according to claim 1, wherein said amplifier is formed on the main surface of said first semiconductor substrate by diffusion, said insulating layer formed on said amplifier being provided with an etched through hole for enabling connection of said electrode to said amplifier, said electrode being a vapor-deposited electrode, and said second semiconductor substrate having a diaphragm formed therein by etching the surface of said second semiconductor substrate opposite to the surface thereof facing said electrode so as to form a depression.

9. A method of manufacturing a capacitive pressure sensor comprising the steps of:
    forming an amplifier on the main surface of a first semiconductor substrate and forming an insulating film on the surface of said amplifier;
    forming at least one electrode on said insulating film and electrically connecting said electrode to said amplifier;
    forming a diaphragm in a second semiconductor substrate and disposing said diaphragm in opposition to said electrode to form a capacitor between said diaphragm and said electrode; and
    bonding anodically said first and second semiconductor substrates using a glass layer.

10. A method of manufacturing a capacitive pressure sensor according to claim 9, further comprising the step of forming a resistor network for trimming in the surface region of said first semiconductor substrate other than the surface region thereof occupied by said second semiconductor substrate, and the step of trimming a part of the said resistor network.

11. A method of manufacturing a capacitive pressure sensor according to claim 9 or 10, wherein a plurality of sensors with the same structure are simultaneously formed on said first and second semiconductor substrates in said steps, and further comprising a step for pelletizing the resultant structure into respective sensors.

12. A method of manufacturing a capacitive pressure sensor according to claim 9, wherein said glass layer is formed by sputtering.

13. A method of manufacturing a capacitive pressure sensor according to claim 9, wherein said glass layer is formed by chemical vapor deposition.

14. A method of manufacturing a capacitive pressure sensor according to claim 9, wherein said amplifier is formed on the main surface of said first semiconductor substrate by a diffusion process, said insulating film on the surface of said amplifier is etched to form a through hole therein, said at least one electrode being vapor-deposited on said insulating film and electrically connected to said amplifier through said through hole, said diaphragm in said second semiconductor substrate being formed by etching the surface of said second semiconductor substrate opposite to the surface thereof facing said electrode.

* * * * *